(12) United States Patent
Chou

(10) Patent No.: US 11,843,311 B2
(45) Date of Patent: Dec. 12, 2023

(54) SWITCHING POWER SUPPLY MODULE AND MEMORY STORAGE DEVICE

(71) Applicant: PHISON ELECTRONICS CORP., Miaoli (TW)

(72) Inventor: Shu-Han Chou, New Taipei (TW)

(73) Assignee: PHISON ELECTRONICS CORP., Miaoli (TW)

( * ) Notice: Subject to any disclaimer, the term of this patent is extended or adjusted under 35 U.S.C. 154(b) by 129 days.

(21) Appl. No.: 17/541,251

(22) Filed: Dec. 3, 2021

(65) Prior Publication Data

US 2023/0141062 A1 May 11, 2023

(30) Foreign Application Priority Data

Nov. 10, 2021 (TW) .................................. 110141829

(51) Int. Cl.
*G11C 5/14* (2006.01)
*H02M 1/00* (2006.01)
(Continued)

(52) U.S. Cl.
CPC ...... *H02M 1/0045* (2021.05); *G06F 13/1668* (2013.01); *G06F 13/4282* (2013.01);
(Continued)

(58) Field of Classification Search
CPC ............. G06F 13/1668; G06F 13/4282; G06F 2213/0026; G11C 16/30; G11C 16/0483; G11C 16/22; G11C 5/14
See application file for complete search history.

(56) References Cited

U.S. PATENT DOCUMENTS

2015/0162055 A1\* 6/2015 Yoo ........................ G11C 5/147
365/226
2016/0105117 A1\* 4/2016 Yang ................. H02M 3/33523
363/21.15
(Continued)

FOREIGN PATENT DOCUMENTS

| CN | 1396509 | 2/2003 |
| CN | 1302596 | 2/2007 |
| TW | 201315122 | 4/2013 |

OTHER PUBLICATIONS

"Office Action of Taiwan Counterpart Application", dated Aug. 2, 2022, p. 1-p. 6.
(Continued)

*Primary Examiner* — Hien N Nguyen
(74) *Attorney, Agent, or Firm* — JCIPRNET

(57) ABSTRACT

A switching power supply module and a memory storage device are disclosed. The switching power supply module includes a first voltage regulation circuit, a second voltage regulation circuit, a switch circuit and a control circuit. The first voltage regulation circuit is configured to regulate an original power as a first power. The second voltage regulation circuit is configured to regulate the original power as a second power. The control circuit is configured to control the switch circuit to conduct a first power supply path under a first status to provide the first power to the first power supply target. The control circuit is further configured to control the switch circuit to conduct a second power supply path under a second status to provide the second power to the second power supply target.

23 Claims, 5 Drawing Sheets

(51) Int. Cl.
  *G06F 13/42*    (2006.01)
  *G11C 16/30*    (2006.01)
  *G06F 13/16*    (2006.01)
  *G11C 16/04*     (2006.01)

(52) U.S. Cl.
  CPC ...... *G11C 16/30* (2013.01); *G06F 2213/0026* (2013.01); *G11C 16/0483* (2013.01)

(56) References Cited

U.S. PATENT DOCUMENTS

2017/0346275 A1* 11/2017 Zhang .................... H01H 73/18
2020/0371697 A1* 11/2020 Kao ....................... G11C 16/22
2021/0175729 A1*  6/2021 Rea ...................... H01M 10/486
2022/0093173 A1*  3/2022 Kamada ................. G11C 5/141

OTHER PUBLICATIONS

"Office Action of China Counterpart Application", dated Mar. 18, 2023, p. 1-p. 10.

* cited by examiner

SWITCHING POWER SUPPLY MODULE AND MEMORY STORAGE DEVICE

CROSS-REFERENCE TO RELATED APPLICATION

This application claims the priority benefit of Taiwan application serial no. 110141829, filed on Nov. 10, 2021. The entirety of the above-mentioned patent application is hereby incorporated by reference herein and made a part of this specification.

BACKGROUND

Technical Field

The disclosure relates to a power supply technology, and particularly relates to a switching power supply module and a memory storage device.

Description of Related Art

Most electronic devices are provided with a regulator to regulate (for example, step down) the input power to an appropriate value and supply the regulated power to various electronic circuits inside the electronic device. General regulators include direct current to direct current (DC/DC) regulators and low dropout (LDO) regulators. The DC/DC regulator is a regulating circuit with high power utilization efficiency. For example, when a DC/DC regulator performs a step-down operation, the DC/DC regulator can generally maintain a power utilization rate of 90% or more. Therefore, the DC/DC regulators are more commonly utilized to supply power to electronic circuits that consume more power. On the other hand, when the LDO regulator performs a step-down operation, the LDO regulator consumes excess power in the form of heat, and therefore the power utilization efficiency of the LDO regulator is poor. Accordingly, compared to DC/DC regulators, LDO regulators are more suitable for supplying power with small current. In addition, compared to DC/DC regulators, LDO regulators have the advantage of lower construction cost. Therefore, how to simultaneously configure these two regulators in the same electronic device and make them complement each other in operation is actually one of the issues that practitioners in the art are devoted to exploring.

SUMMARY

The disclosure provides a switching power supply module and a memory storage device, which can improve the operation efficiency of different types of regulation circuits when they are utilized to cooperate with each other.

An exemplary embodiment of the disclosure provides a switching power supply module. The switching power supply module includes a first voltage regulation circuit, a second voltage regulation circuit, a switch circuit and a control circuit. The first voltage regulation circuit is configured to regulate an original power as a first power. The second voltage regulation circuit is configured to regulate the original power as a second power. The control circuit is coupled to the first voltage regulation circuit, the second voltage regulation circuit, and the switch circuit. The control circuit is configured for controlling the switch circuit to operate in one of a first state and a second state. In the first state, the switch circuit is configured to provide the first power to the first power supply target and the second power supply target. In the second state, the switch circuit is further configured to cut off the power supply path between the first voltage regulation circuit and the first power supply target and provide the second power to the second power supply target. The power conversion efficiency of the first voltage regulation circuit is higher than the power conversion efficiency of the second voltage regulation circuit.

An exemplary embodiment of the disclosure further provides a memory storage device, which includes a rewritable non-volatile memory module, a peripheral component interconnect express (PCI Express) interface, and a switching power supply module. The switching power supply module is coupled to the rewritable non-volatile memory module and the PCI express interface. The first voltage regulation circuit in the switching power supply module is configured to regulate the original power as the first power. The second voltage regulation circuit in the switching power supply module is configured to regulate the original power as the second power. The switching power supply module is configured to operate in one of the first state and the second state. In the first state, the switching power supply module is configured to provide the first power to the rewritable non-volatile memory module and the PCT express interface. In the second state, the switching power supply module is configured to cut off the power supply path between the first voltage regulation circuit and the first power supply target and provide the second power to the PCI express interface. The power conversion efficiency of the first voltage regulation circuit is higher than the power conversion efficiency of the second voltage regulation circuit.

Based on the above, the first voltage regulation circuit is configured to regulate the original power as the first power. The second voltage regulation circuit is configured to regulate the original power as the second power. In particular, the power conversion efficiency of the first voltage regulation circuit is higher than that of the second voltage regulation circuit. The control circuit can selectively control the switch circuit to conduct the first power supply path to provide the first power to the first power supply target in the first state, or conduct the second power supply path to provide the second power to the second power supply target in the second state. In this way, the operation efficiency of the two different types of voltage regulation circuits can be improved when they are operated in cooperation with each other.

DESCRIPTION OF THE EMBODIMENTS

A number of exemplary embodiments are presented below to illustrate the present disclosure, but the present disclosure is not limited to the multiple exemplary embodiments illustrated. Also, appropriate combinations of the exemplary embodiments are allowed. The term "coupling" used in the description of this disclosure (including claims) can refer to any direct or indirect connection means. For example, if the text describes that the first device is coupled to the second device, it should be interpreted as that the first device can be directly connected to the second device, or the first device can be indirectly connected to the second device through other devices or some kind of connection means. In addition, the term "signal" can refer to at least one current, voltage, charge, temperature, data, or any other one or more signals.

Figure 1:
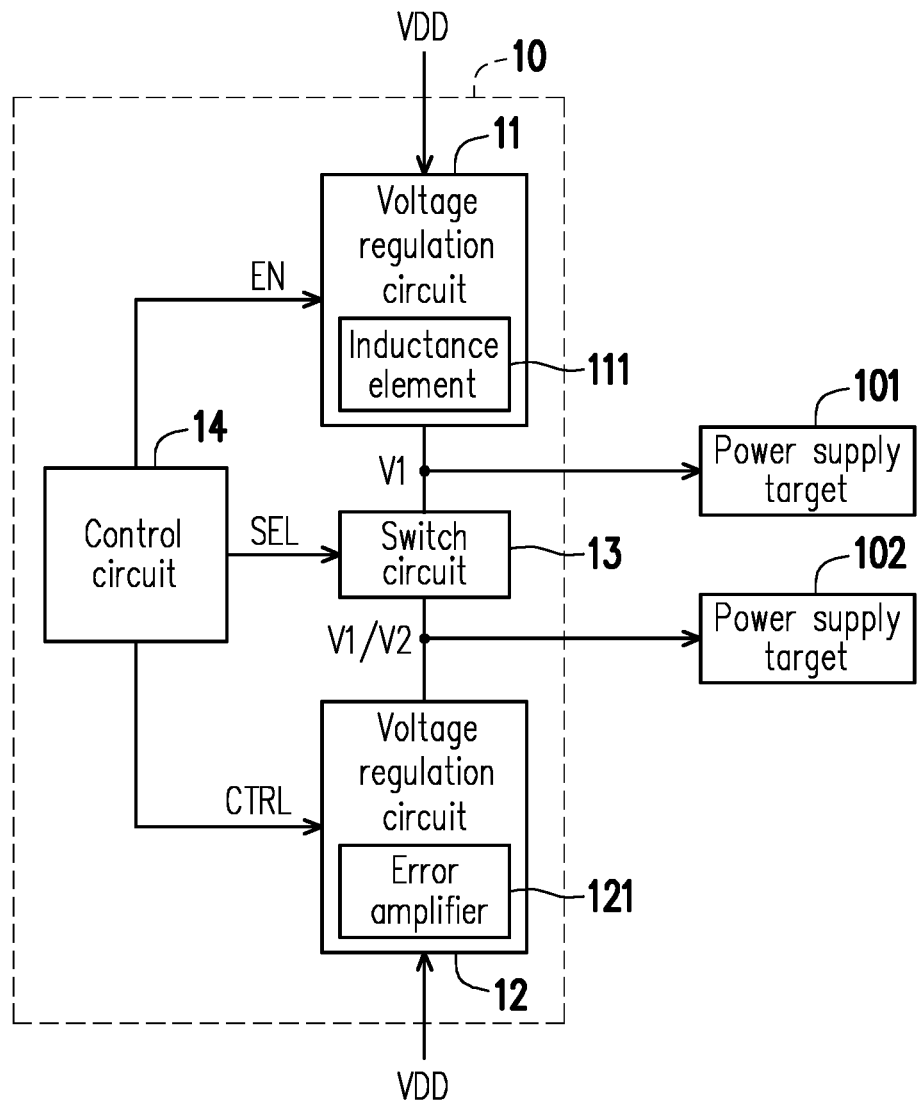
FIG. 1 is a schematic view of a switching power supply module according to an exemplary embodiment of the disclosure.

FIG. 1 is a schematic view of a switching power supply module according to an exemplary embodiment of the disclosure. Please refer to FIG. 1, the switching power supply module 10 may include a voltage regulation circuit (also referred to as a first voltage regulation circuit) 11, a voltage regulation circuit (also referred to as a second voltage regulation circuit) 12, a switch circuit 13 and a control circuit 14.

The voltage regulation circuit 11 can be used to regulate a voltage (also referred to as original power) VDD as a voltage (also referred to as first power) V1. For example, the voltage V1 may be lower than the voltage VDD. The voltage regulation circuit 12 can be used to regulate the voltage VDD as a voltage (also referred to as second power) V2. For example, the voltage V2 may be lower than the voltage VDD. In particular, the power conversion efficiency of the voltage regulation circuit 11 is higher than the power conversion efficiency of the voltage regulation circuit 12.

In an exemplary embodiment, the voltage regulation circuit 11 may include an inductance element 111. The voltage regulation circuit 11 can be used to regulate the voltage VDD as the voltage V1 by charging the inductance element 111. For example, the voltage regulation circuit 11 may include a direct current to direct current (DC/DC) regulator.

In an exemplary embodiment, the voltage regulation circuit 12 may include an error amplifier 121. The voltage regulation circuit 12 can be used to regulate the voltage VDD to the voltage V2 based on the feedback of the error amplifier 121. For example, the voltage regulation circuit 12 may include a low dropout (LDO) regulator.

The switch circuit 13 is coupled to the voltage regulation circuit 11, the voltage regulation circuit 12, and the control circuit 14. The switch circuit 13 (or the switching power supply module 10) can be selectively operated in one of the first state and the second state. In the first state, the switch circuit 13 can simultaneously provide the voltage V1 generated by the voltage regulation circuit 11 to a load circuit (also referred to as the first power supply target) 101 and a load circuit (also referred to as the second power supply target) 102. That is to say, in the first state, the voltage regulation circuit 11 can use the voltage V1 to simultaneously supply power to the load circuits 101 and 102 through the switch circuit 13. On the other hand, in the second state, the switch circuit 13 can cut off the power supply path between the voltage regulation circuit 11 and the load circuit 101 and provide the voltage V2 generated by the voltage regulation circuit 12 to the load circuit 102. That is, in the second state, the voltage regulation circuit 12 can use the voltage V2 to supply power to the load circuit 102 only through the switch circuit 13.

The control circuit 14 is coupled to the voltage regulation circuit 11, the voltage regulation circuit 12, and the switch circuit 13. The control circuit 14 can be configured to control the switch circuit 13 to operate in the first state or the second state. For example, the control circuit 14 can send a signal (also referred to as a switch signal) SEL to the switch circuit 13. The signal SEL can be used to control the switch circuit 13 to operate in the first state or the second state. The switch circuit 13 can automatically operate in the first state or the second state in response to the signal SEL. For example, the control circuit 14 may include a microprocessor, a digital signal processor (DSP), a programmable controller, an application specific integrated circuit (ASIC), a programmable logic device (PLD) or other similar devices or a combination of these devices.

Figure 2:
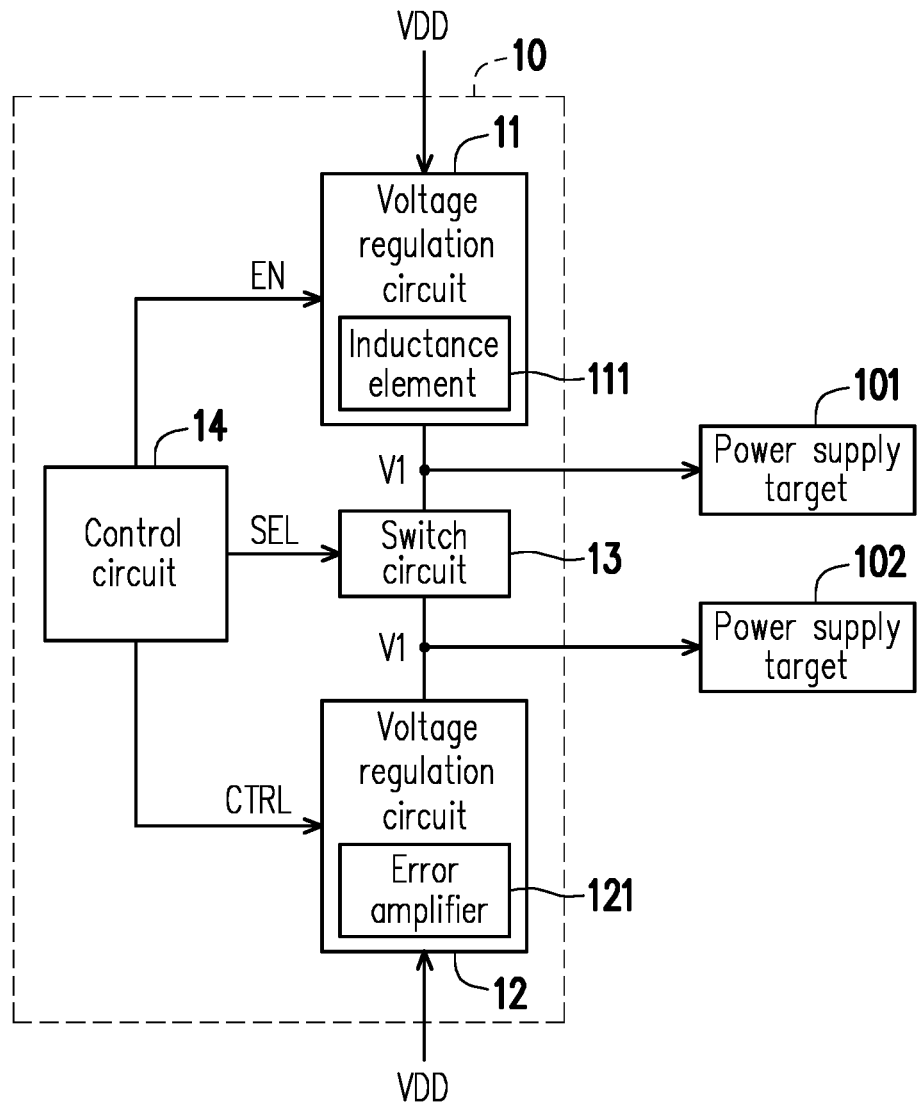
FIG. 2 is a schematic view illustrating a switching power supply module or a switching circuit operating in a first state according to an exemplary embodiment of the disclosure.

FIG. 2 is a schematic view illustrating a switching power supply module or a switching circuit operating in a first state according to an exemplary embodiment of the disclosure. Please refer to FIG. 2, when it is necessary to supply power to the load circuits 101 and 102 simultaneously, the control circuit 14 can send a signal (also referred to as an enable signal) EN to the voltage regulation circuit 11 to activate the voltage regulation circuit 11. The activated voltage regulation circuit 11 can generate the voltage V1. On the other hand, the control circuit 14 can send a signal SEL to the switch circuit 13 to control the switch circuit 13 to operate in the first state. In the first state, the switch circuit 13 can conduct the power supply path between the voltage regulation circuit 11 and the load circuit 101 and the power supply path between the voltage regulation circuit 11 and the load circuit 102. In this manner, in the first state, the switch circuit 13 can provide the voltage V1 generated by the voltage regulation circuit 11 to the load circuits 101 and 102 to supply power to the load circuits 101 and 102 simultaneously.

Figure 3:
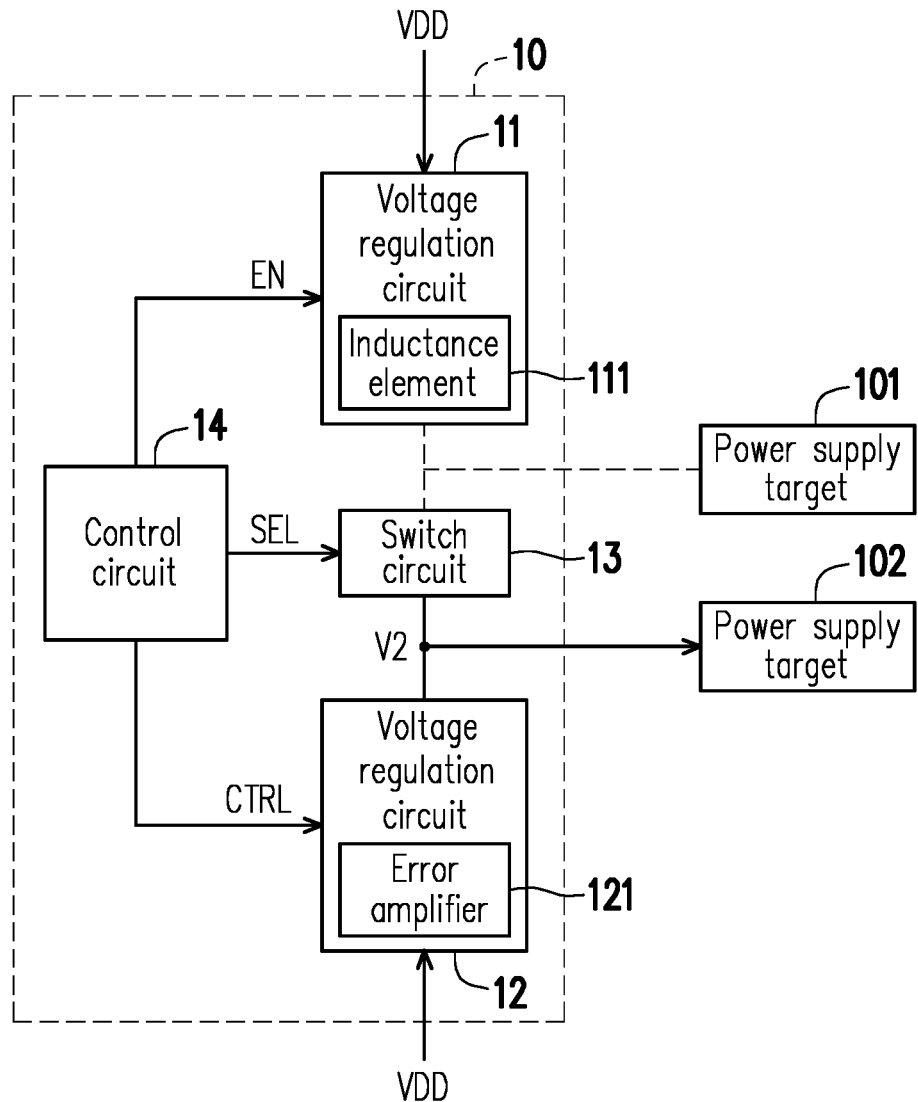
FIG. 3 is a schematic view illustrating a switching power supply module or a switching circuit operating in a second state according to an exemplary embodiment of the disclosure.

FIG. 3 is a schematic view illustrating a switching power supply module or a switching circuit operating in a second state according to an exemplary embodiment of the disclosure. Referring to FIG. 3, when the load circuit 101 does not need to be powered, the control circuit 14 can turn off the voltage regulation circuit 11 through the signal EN. The turned-off voltage regulation circuit 11 may not generate the voltage V1. On the other hand, the control circuit 14 can send a signal SEL to the switch circuit 13 to control the switch circuit 13 to operate in the second state. In the second state, the switch circuit 13 can cut off the power supply path between the voltage regulation circuit 11 and the load circuit 101 to stop supplying power to the load circuit 101. Meanwhile, in the second state, the switch circuit 13 can conduct the power supply path between the voltage regulation circuit 12 and the load circuit 102 to use the voltage V2 generated by the voltage regulation circuit 12 to supply power to the load circuit 102.

It should be noted that the power utilization rate (or power conversion efficiency) of the voltage regulation circuit 11 in the operation of regulating the voltage VDD as the voltage V1 (for example, stepping down the voltage VDD) is higher than the power utilization rate (or power conversion efficiency) of the voltage regulation circuit 12 in the operation of regulating the voltage VDD as the voltage V2 (for example, stepping down the voltage VDD). Therefore, in the exemplary embodiment of FIG. 2, when the load circuits 101 and 102 need to be powered simultaneously, the voltage regulation circuit 11 is used to simultaneously supply power with large current to the load circuits 101 and 102, which can effectively improve the overall power utilization rate. On the other hand, in the exemplary embodiment of FIG. 3, when only the load circuit 102 needs to be powered, the voltage regulation circuit 12 is used to supply power with small current to the load circuit 102, which can effectively reduce the static power consumption generated by the operation of the voltage regulation circuit 11.

It should be noted that in the second state shown in FIG. 3, the voltage regulation circuit 11 is in an OFF state. Before switching the switching power supply module 10 or the switching circuit 13 from the second state to the first state, the control circuit 13 can activate the voltage regulation circuit 11 through the signal EN. The activated voltage regulation circuit 11 can generate the voltage V1. Then, the control circuit 13 can set the voltage V2 generated by the voltage regulation circuit 12 according to the voltage V1. For example, the control circuit 13 can send a signal (also referred to as a voltage control signal CTRL) to the voltage regulation circuit 12 to instruct the voltage regulation circuit 12 to regulate the voltage V2. For example, the control circuit 13 may instruct the voltage regulation circuit 12 to set the voltage V2 not to be higher than the voltage V1. After the voltage V2 is set according to the voltage V1, the control circuit 13 can control the switch circuit 13 to switch from the second state to the first state through the signal SEL. For example, after the voltage V2 is set according to the voltage V1, when the voltage V2 is not higher than the voltage V1, the control circuit 13 can control the switch circuit 13 to switch from the second state to the first state through the signal SEL (for example, from the power supply state of FIG. 3 to the power supply state of FIG. 2). In addition, after the voltage V2 is set according to the voltage V1, the control circuit 13 can turn off the voltage regulation circuit 12. In this way, during the process of switching the switch circuit 13 from the second state to the first state, the current provided to the load circuit 102 can be gently converted from being originally supplied by the voltage regulation circuit 12 into being supplied by the voltage regulation circuit 11, thereby reducing the adverse effect on the load circuit 102 due to the change of power supply.

On the other hand, in the first state shown in FIG. 2, the voltage regulation circuit 11 is in an activated state to continuously generate the voltage V1. Before switching the switching power supply module 10 or the switch circuit 13 from the first state to the second state, the control circuit 13 can set the voltage V2 generated by the voltage regulation circuit 12 according to the voltage V1. For example, the control circuit 13 can instruct the voltage regulation circuit 12 to set the voltage V2 not to be lower than the voltage V1 through the signal CTRL. After the voltage V2 is set according to the voltage V1, the control circuit 13 can control the switch circuit 13 to switch from the first state to the second state through the signal SEL. For example, after instructing the voltage regulation circuit 12 to regulate the voltage V2, when the voltage V2 is not lower than the voltage V1, the control circuit 13 can control the switch circuit 13 to switch from the first state to the second state through the signal SEL (for example, switching from the power supply state of FIG. 2 to the power supply state of FIG. 3). In addition, after the voltage V2 is set according to the voltage V1, the control circuit 13 can turn off the voltage regulation circuit 11 to stop generating the voltage V1. In this manner, during the process of switching the switch circuit 13 from the first state to the second state, the current provided to the load circuit 102 can be gently converted from being originally supplied by the voltage regulation circuit 11 into being supplied by the voltage regulation circuit 12, thereby reducing the adverse effect on the load circuit 102 due to the change of power supply.

In an exemplary embodiment, the operation of setting the voltage V2 according to the voltage V1 may also be setting the voltage V2 to be close to or the same as the voltage V1 by the voltage regulation circuit 12. In this way, in the process of switching the switch circuit 13 from the first state to the second state or from the second state to the first state, the voltages V1 and V2 can become consistent, so that the current provided to the load circuit 102 can be gently switched between being supplied by the voltage regulation circuit 11 and the voltage regulation circuit 12.

In an exemplary embodiment, the control circuit 13 can detect the voltage 11 in real time at the output terminal of the voltage regulation circuit 11. Based on the detected voltage 11, the control circuit 13 can instruct the voltage regulation circuit 12 to regulate the voltage V2, for example, to make the voltage V2 follow or be close to the voltage 11.

Figure 4:
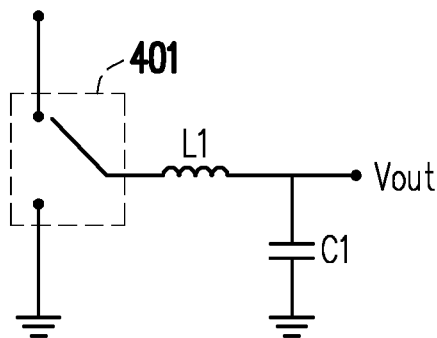
FIG. 4 is a schematic view of a first voltage regulation circuit according to an exemplary embodiment of the disclosure.

FIG. 4 is a schematic view of a first voltage regulation circuit according to an exemplary embodiment of the disclosure. Referring to FIG. 1 and FIG. 4, the voltage regulation circuit 11 may include a switching element 401, an inductance element L1, and a capacitance element C1. The switching element 401 can be in an ON or OFF state to charge or discharge the inductance element L1, so as to generate an output voltage Vout according to the input voltage Vin. In addition, the voltage V1 can be generated according to the output voltage Vout of FIG. 4. It should be noted that in different exemplary embodiments, the configuration of the electronic components in the voltage regulation circuit 11 can be adjusted according to practical requirements to meet the functional requirements of the corresponding DC/DC regulator.

Figure 5:
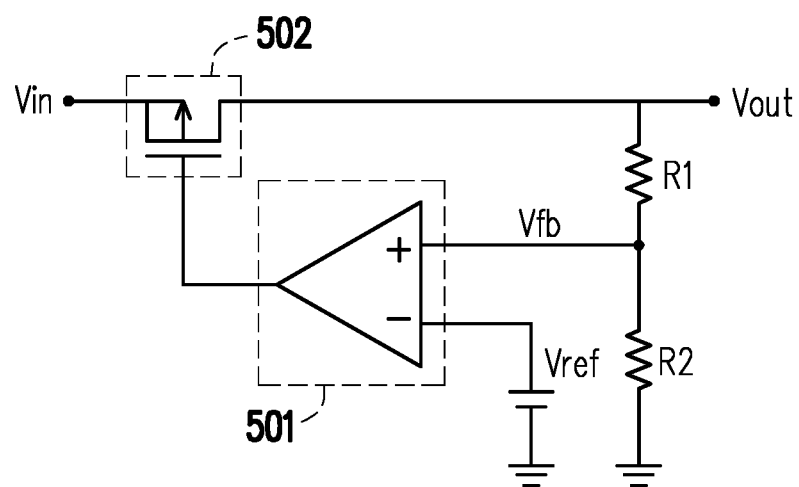
FIG. 5 is a schematic view of a second voltage regulation circuit according to an exemplary embodiment of the disclosure.

FIG. 5 is a schematic view of a second voltage regulation circuit according to an exemplary embodiment of the disclosure. Referring to FIG. 1 and FIG. 5, the voltage regulation circuit 12 may include an error amplifier 501, a transistor element 502, an impedance element R1, an impedance element R2, and a reference voltage Vref. The error amplifier 501 can control the voltage difference between the two ends of the transistor element 502 according to the voltage Vfb and the reference voltage Vref, thereby regulating the output voltage Vout. In other words, the error amplifier 501 can feed back the output voltage Vout to the regulation of the voltage difference between the two ends of the transistor element 502, thereby affecting the output voltage Vout. The voltage V2 can be generated according to the output voltage Vout of FIG. 5.

In an exemplary embodiment, during the period when the voltage V2 is set according to the voltage V1, the control circuit 13 of FIG. 1 may set the voltage Vref according to the voltage V1. For example, the voltage Vref is directed to or coupled to the output terminal of the voltage regulation circuit 11. For example, the voltage Vref can be coupled to the output terminal of the voltage regulation circuit 11 through a voltage divider circuit. This voltage divider circuit can be used to convert the voltage V1 at the output terminal of the voltage regulation circuit 11 into a voltage Vref (for example, Vref=V1*R2/(R1+R2)). In this way, during the period when the voltage V2 is set according to the voltage V1, the output voltage Vout can gradually become close to or the same as the voltage V1. It should be noted that in different exemplary embodiments, the configuration of the electronic components in the voltage regulation circuit 12 can be adjusted according to practical requirements to meet the functional requirements of the corresponding LDO regulator.

In an exemplary embodiment of FIG. 1, the load circuit 101 may include a rewritable non-volatile memory module, and the load circuit 102 may include a peripheral component interconnect express (PCI Express, PCIe) interface. However, in another exemplary embodiment, the load circuits 101 and 102 may also include other types of electronic circuits or electronic devices.

In an exemplary embodiment, the switching power supply module 10 mentioned in the foregoing exemplary embodiment may be disposed in a memory storage device. However, in another exemplary embodiment, the switching power supply module 10 can also be disposed in other types of electronic devices, and is not limited to a memory storage device.

In an exemplary embodiment, a memory storage device (also known as a memory storage system) includes a rewritable non-volatile memory module and a controller (also known as a control circuit). Generally, the memory storage device is used together with a host system, so that the host system can write data to the memory storage device or read data from the memory storage device.

Figure 6:
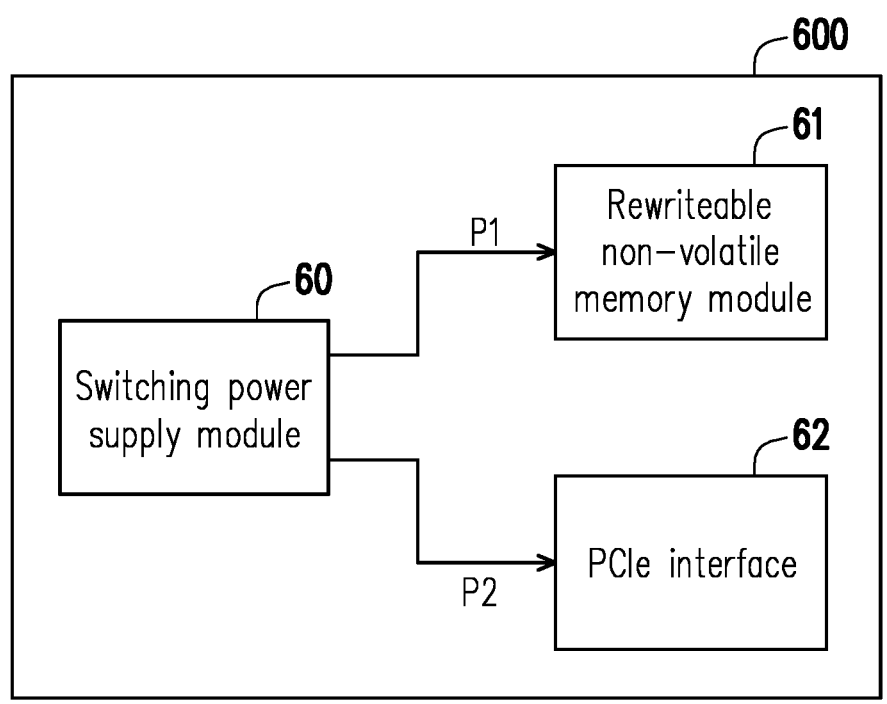
FIG. 6 is a schematic view of a memory storage device according to an exemplary embodiment of the disclosure.

FIG. 6 is a schematic view of a memory storage device according to an exemplary embodiment of the disclosure. Referring to FIG. 6, the memory storage device 600 includes a switching power supply module 60, a rewritable non-volatile memory module 61, and a PCI express (PCIe) interface 62. The rewritable non-volatile memory module 61 can be used to store data from the host system. The PCIe interface 62 can be used to connect to a host system.

The switching power supply module 60 may include a switching power supply module 10 of FIG. 1. The rewritable non-volatile memory module 61 may be regarded as the load circuit 101 of FIG. 1, and the PCIe interface 62 may be regarded as the load circuit 102 of FIG. 1. The switching power supply module 60 can use power supplies P1 and P2 to supply power to the rewritable non-volatile memory modules 61 and 62, respectively. For example, the power supply P1 can be provided by the voltage regulation circuit 11 in FIG. 1, and the power supply P2 can be selectively provided by the voltage regulation circuit 11 or 12 in FIG. 1 under different states of the switching power supply module 60. For details of related operations, please refer to the descriptions of the foregoing exemplary embodiments, and no further description is incorporated herein. In addition, in an exemplary embodiment, the rewritable non-volatile memory module 61 and/or the PCIe interface 62 can also be substituted by other types of electronic circuits or electronic devices, which are not limited by the disclosure.

The rewritable non-volatile memory module 61 is used to store data written by the host system. The rewritable non-volatile memory module 61 may include a single level cell (SLC) NAND flash memory module (that is, each memory cell of a SLC NAND flash memory module is capable of storing 1 bit of data), a multi level cell (MLC) NAND flash memory module (that is, each memory cell of an MLC NAND flash memory module is capable of storing 2 bits of data), a triple level cell (TLC) NAND flash memory module (that is, each memory cell of a TLC NAND flash memory module is capable of storing 3 bits of data), a quad level cell (QLC) NAND flash memory module (that is, each memory cell of a QLC NAND flash memory module is capable of storing 4 bits of data), other flash memory modules, or other memory modules with the same characteristics.

In summary, the switching power supply module provided by the exemplary embodiment of the disclosure can selectively conduct or switch the power supply paths of different types of voltage regulation circuits (such as DC/DC regulators and LDO regulators), so as to achieve the best economic benefits of these voltage regulation circuits in joint operation. In addition, by making the output voltage of the LDO regulator to follow or become close to the output voltage of the DC/DC regulator in advance during the switching of the power supply paths, the adverse effects on the load circuit caused by the switching of the power supply paths can be reduced.

Although the present disclosure has been disclosed in the above embodiments, it is not intended to limit the present disclosure. Anyone with ordinary knowledge in the technical field can make some changes and modification without departing from the spirit and scope of the present disclosure. Therefore, the scope to be protected by the present disclosure shall be subject to the scope of the attached claims.

What is claimed is:

1. A switching power supply module, comprising:
    a first voltage regulation circuit, configured to regulate an original power as a first power;
    a second voltage regulation circuit, configured to regulate the original power as a second power;
    a switch circuit; and
    a control circuit, coupled to the first voltage regulation circuit, the second voltage regulation circuit, and the switch circuit,
    wherein the control circuit is configured for controlling the switch circuit to operate in one of a first state and a second state,
    in the first state, the switch circuit is configured to provide the first power to a first power supply target and a second power supply target,
    in the second state, the switch circuit is further configured to cut off a power supply path between the first voltage regulation circuit and the first power supply target and provide the second power to the second power supply target, and
    a power conversion efficiency of the first voltage regulation circuit is higher than a power conversion efficiency of the second voltage regulation circuit.

2. The switching power supply module according to claim 1, wherein the first voltage regulation circuit regulates the original power as the first power by charging an inductance element, and
    the second voltage regulation circuit regulates the original power as the second power based on a feedback of an error amplifier.

3. The switching power supply module according to claim 1, wherein the operation in which the control circuit controls the switch circuit to operate in the one of the first state and the second state comprises:
    in the second state, activating the first voltage regulation circuit to generate the first power;
    setting the second power according to the first power; and
    after setting the second power according to the first power, controlling the switch circuit to switch from the second state to the first state.

4. The switching power supply module according to claim 3, wherein the operation of setting the second power according to the first power comprises:
    detecting the first power at an output terminal of the first voltage regulation circuit.

5. The switching power supply module according to claim 3, wherein the operation of setting the second power according to the first power comprises:
setting the second power to be no higher than the first power.

6. The switching power supply module according to claim 3, wherein after setting the second power according to the first power, the operation of controlling the switch circuit to switch from the second state to the first state comprises:
in the state where the second power is not higher than the first power, controlling the switch circuit to switch from the second state to the first state.

7. The switching power supply module according to claim 1, wherein the operation in which the control circuit controls the switch circuit to operate in the one of the first state and the second state comprises:
in the first state, setting the second power according to the first power;
after setting the second power according to the first power, controlling the switch circuit to switch from the first state to the second state; and
in the second state, turning off the first voltage regulation circuit.

8. The switching power supply module according to claim 7, wherein the operation of setting the second power according to the first power comprises:
setting the second power to be no less than the first power.

9. The switching power supply module according to claim 7, wherein after setting the second power according to the first power, the operation of controlling the switch circuit to switch from the first state to the second state comprises:
in the state where the second power is not less than the first power, controlling the switch circuit to switch from the first state to the second state.

10. The switching power supply module according to claim 1, wherein the first voltage regulation circuit comprises a direct current to direct current (DC/DC) regulator, and the second voltage regulation circuit comprises a low dropout (LDO) regulator.

11. The switching power supply module according to claim 1, wherein the first power supply target comprises a rewritable non-volatile memory module, and the second power supply target comprises a peripheral component interconnect express (PCI Express, PCIe) interface.

12. A memory storage device, comprising:
a rewritable non-volatile memory module;
a PCIe interface;
a switching power supply module, coupled to the rewritable non-volatile memory module and the PCIe interface,
wherein a first voltage regulation circuit in the switching power supply module is configured to regulate an original power to a first power,
a second voltage regulation circuit in the switching power supply module is configured to regulate the original power to a second power,
wherein the switching power supply module is configured to operate in one of a first state and a second state,
in the first state, the switching power supply module is configured to provide the first power to the rewritable non-volatile memory module and the PCIe interface,
in the second state, the switching power supply module is configured to cut off a power supply path between the first voltage regulation circuit and a first power supply target and provide the second power to the PCIe interface, and
a power conversion efficiency of the first voltage regulation circuit is higher than that of the second voltage regulation circuit.

13. The memory storage device according to claim 12, wherein the first voltage regulation circuit regulates the original power as the first power by charging an inductance element, and
the second voltage regulation circuit regulates the original power as the second power based on a feedback of an error amplifier.

14. The memory storage device according to claim 12, wherein the operation in which the switching power supply module is operated in the one of the first state and the second state comprises:
in the second state, activating the first voltage regulation circuit to generate the first power;
setting the second power according to the first power; and
after setting the second power according to the first power, switching from the second state to the first state.

15. The memory storage device according to claim 14, wherein the operation of setting the second power according to the first power comprises:
detecting the first power at an output terminal of the first voltage regulation circuit.

16. The memory storage device according to claim 14, wherein the operation of setting the second power according to the first power comprises:
setting the second power to be no higher than the first power.

17. The memory storage device according to claim 14, wherein after setting the second power according to the first power, the operation of switching from the second state to the first state comprises:
in the state where the second power is not higher than the first power, switching from the second state to the first state.

18. The memory storage device according to claim 12, wherein the operation in which the switching power supply module is operated in the one of the first state and the second state comprises:
in the first state, setting the second power according to the first power;
after setting the second power according to the first power, switching from the first state to the second state; and
in the second state, turning off the first voltage regulation circuit.

19. The memory storage device according to claim 18, wherein the operation of setting the second power according to the first power comprises:
setting the second power to be no less than the first power.

20. The memory storage device according to claim 18, wherein after setting the second power according to the first power, the operation of switching from the first state to the second state comprises:
in the state where the second power is not less than the first power, switching from the first state to the second state.

21. The memory storage device according to claim 12, wherein the first voltage regulation circuit comprises a direct current to direct current (DC/DC) regulator, and the second voltage regulation circuit comprises a low dropout (LDO) regulator.

22. A switching power supply module, comprising:
a first voltage regulation circuit, configured to regulate an original power as a first power;
a second voltage regulation circuit, configured to regulate the original power as a second power;

a switch circuit; and a control circuit, coupled to the first voltage regulation circuit, the second voltage regulation circuit, and the switch circuit, wherein the control circuit is configured for controlling the switch circuit to operate in one of a first state and a second state, in the first state, a power supply path of a first power supply target is conducted, and the first voltage regulation circuit provides the first power to the first power supply target and a second power supply target, in the second state, the power supply path of the first power supply target is cut off, and the second voltage regulation circuit provides the second power to the second power supply target, and a power conversion efficiency of the first voltage regulation circuit is higher than a power conversion efficiency of the second voltage regulation circuit.

23. A memory storage device, comprising:
a rewritable non-volatile memory module;
a PCIe interface;
a switching power supply module, coupled to the rewritable non-volatile memory module and the PCIe interface, wherein a first voltage regulation circuit in the switching power supply module is configured to regulate an original power to a first power, a second voltage regulation circuit in the switching power supply module is configured to regulate the original power to a second power, wherein the switching power supply module is configured to operate in one of a first state and a second state, in the first state, a power supply path of the rewritable non-volatile memory module is conducted, and the first voltage regulation circuit provides the first power to the rewritable non-volatile memory module and the PCIe interface, in the second state, the power supply path of the rewritable non-volatile memory module is cut off, and the second voltage regulation circuit provides the second power to the PCIe interface, and a power conversion efficiency of the first voltage regulation circuit is higher than that of the second voltage regulation circuit.

* * * * *